United States Patent
Vemulapalli et al.

(10) Patent No.: US 7,205,924 B2
(45) Date of Patent: Apr. 17, 2007

(54) CIRCUIT FOR HIGH-RESOLUTION PHASE DETECTION IN A DIGITAL RF PROCESSOR

(75) Inventors: Sudheer K. Vemulapalli, Allen, TX (US); John Wallberg, Richardson, TX (US); Prasant K. Vallur, Wylie, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/274,965

(22) Filed: Nov. 15, 2005

(65) Prior Publication Data

US 2006/0103566 A1 May 18, 2006

Related U.S. Application Data

(60) Provisional application No. 60/629,829, filed on Nov. 18, 2004.

(51) Int. Cl.
*H03M 1/50* (2006.01)
(52) U.S. Cl. ....................... 341/166; 341/155
(58) Field of Classification Search ............... 341/166, 341/167, 118, 157
See application file for complete search history.

(56) References Cited

U.S. PATENT DOCUMENTS 4,090,191 A * 5/1978 Kinbara ..................... 341/118
6,429,693 B1 * 8/2002 Staszewski et al. ........... 327/12

OTHER PUBLICATIONS

R. B. Staszewski, S. Vemulapalli, P. Vallur et al., "1.3 V 20 ps Time-to-Digital Converter for Frequency Synthesis in 90 nm CMOS," IEEE Trans. on Circuits and Systems II: Express Briefs, 2005, no month.

* cited by examiner

*Primary Examiner*—Brian Young
(74) *Attorney, Agent, or Firm*—Dolly Y. Wu; W. James Brady, III; Frederick J. Telecky, Jr.

(57) ABSTRACT

A novel time-to-digital converter (TDC) used as a phase/frequency detector and charge pump replacement in an all-digital PLL within a digital radio processor. The TDC core is based on a pseudo-differential digital architecture making it insensitive to NMOS and PMOS transistor mismatches. The time conversion resolution is equal to an inverter propagation delay, e.g., 20 ps, which is the finest logic-level regenerative timing in CMOS. The TDC is self calibrating with the estimation accuracy better than 1%. The TDC circuit can also serve as a CMOS process strength estimator for analog circuits in large SoC dies. The circuit also employs power management circuitry to reduce power consumption to a very low level.

27 Claims, 9 Drawing Sheets

CIRCUIT FOR HIGH-RESOLUTION PHASE DETECTION IN A DIGITAL RF PROCESSOR

REFERENCE TO RELATED APPLICATIONS

This application claims priority to U.S. Provisional Application Ser. No. 60/629,829, filed Nov. 18, 2004, entitled "A Circuit for High-Resolution Phase Detection in a Digital Radio Transceiver", incorporated herein by reference in its entirety.

FIELD OF THE INVENTION

The present invention relates to the field of data communications and more particularly relates to time-to-digital converter with a pseudo-differential circuit architecture for precise phase detection incorporating a phase aligner and power management.

BACKGROUND OF THE INVENTION

Time-to-digital converters (TDC) are well known in the prior art. TDC circuits are currently widely used for time interval measurements in applications such as space science, high-energy physics, laser range finders and in test instrumentation. Recently, TDC circuits have been applied to frequency synthesis in delay locked loops (DLLs) to achieve faster acquisition and to avoid false locking. With the advent of digitally-intensive and all-digital fractional-N phase locked loops (PLLs) in deep-submicron CMOS, the TDC is becoming an attractive replacement of the conventional phase/frequency detector and charge pump. This also enables the replacement of the loop filter, typically requiring large and leaky integrating capacitors, with a simple digital filter.

Prior art TDC circuit architectures utilize an analog approach to first convert the time difference to a voltage and then to convert the voltage to a digital word using an analog to digital converter (ADC). More recent TDC circuit architectures use multiphase ring oscillators and delay locked loops to realize the interpolation of clock edges. The minimum time resolution of these prior art designs, however, is limited to a buffer delay. Other prior art TDC circuit architectures are based on a Vernier line and employ pulse-shrinking techniques. These two methods address the limitation of the coarse intrinsic delay of buffer elements and apply the gate delay difference to improve the resolution below the sub-gate delay. The above approaches, however, are less than ideal since they are analog intensive, require extensive calibration for high-volume production, suffer from long dead time and large power dissipation and require relatively large silicon area.

Thus, there is a need for a time-to-digital circuit architecture that (1) does not suffer from the disadvantages of prior art time-to-digital converters, (2) is well suited for implementation in deep-submicron CMOS processes, (3) takes advantage of the deep-submicron CMOS process strengths of ultra-fast logic switching, (4) avoids the weaker handling of voltage resolution of CMOS processes, (5) can be used as a phase/frequency detector replacement in an all digital PLL, and (6) is insensitive to NMOS and PMOS transistor mismatches.

SUMMARY OF THE INVENTION

The present invention provides a solution to the problems of the prior art by providing a novel time-to-digital converter (TDC) based on a pseudo-differential digital architecture. The TDC circuit architecture can be used as a phase/frequency detector and charge pump replacement in an all-digital PLL within a digital radio transceiver. The pseudo-differential digital architecture of the TDC circuit makes it less sensitive to NMOS and PMOS transistor mismatches. The time conversion resolution is equal to an inverter propagation delay, for example 15–20 ps, depending on the particular process. The inverter propagation delay is the finest logic-level regenerative timing in CMOS. In addition, the TDC circuit of the present invention is self-calibrating, with the estimation accuracy better than 1%, in order to produce the output that is independent from process, voltage and temperature variations. The output could be normalized to a period of the high frequency clock input. The TDC circuit can also serve as a CMOS inverter delay indicator for the purpose of inverter delay normalization, thus also providing an indication of process strength for analog circuits in large system on chip (SoC) dies. The TDC circuit also incorporates power management circuitry to significantly reduce power consumption to a very low level.

The TDC architecture of the present invention takes advantage of the deep-submicron CMOS process strengths of ultra-fast logic switching while avoiding its weaker handling of voltage resolution. It is recognized that an inverter propagation delay is the finest logic-level regenerative timing method in CMOS. To this extent, the invention avoids any control of the inverter delay that would make it slower, such as using current starving techniques or increasing capacitative loads. To maximize performance, the invention also avoids fully differential structures that would require current biasing. The resolution of the TDC circuit of the present invention is the fastest possible intrinsic inverter delay (e.g., 15–20 ps in the particular CMOS process used).

The inverter delay calibration (self calibration) method is fully digital and only involves processing of the TDC circuit output. The TDC circuit of the present invention functions as a built-in estimator of the process strength. The process strength estimate can be used to set the bias current of other analog circuits on the same SoC die. Note that the self-oscillating frequency of the 3-inverter ring oscillator structure is commonly used as a figure-of-merit (FOM) of the deep-submicron CMOS process strength.

The TDC core comprises of inverters and flip-flops and does not require any current biasing, analog interpolation or precise scaling of sub-gate delays. The architecture is based on a pseudo-differential topology that makes it less sensitive to differing strengths of NMOS and PMOS transistors. This brings the TDC resolution down to the intrinsic delay of the inverter, instead of the buffer, as in prior art designs. Taking advantage of the availability of the two opposite phase clocks (or one clock with an opposite phase generated internally), a novel all-digital calibration method of an inverter delay could be run during the normal operation to compensate for temperature and voltage drifts. Since the calibration circuit reports a delay of an intrinsic, uncorrected inverter in digital form, it can be used as a CMOS process strength indicator for process statistics and to calibrate bias current of other analog circuits on the same die. A novel power management scheme through dynamic clock gating is applicable in PLL and other applications where the time-of arrival can be predicted. The TDC has been realized and its resolution has been measured to be as low as 17–21 ps with integral nonlinearity (INL) of 0.7 LSB. This is achieved with very low power consumption and area usage.

As an example application, the TDC circuit of the present invention has been incorporated into the frequency synthesizer portion of a fully compliant GSM/EDGE transceiver constructed in 90 nm CMOS. The function of the TDC in this transceiver circuit is to measure the time difference between the edges of the 1.6–2.0 GHz high-speed PLL clock HCLK and the 26 MHz frequency reference clock FREF, but it could easily adapted for a broader range of applications. It is expected that in this low-voltage digital CMOS environment, picosecond level accurate time interval measurements will become as important as high-resolution A/D conversion in conventional architectures.

The TDC of the present invention, offers significantly better performance compared to previously known solutions: (1) 2–3 times lower phase error in the transmitter, (2) highly linear TDC with 30%–50% better linearity than previous solutions, (3) 2 times improvement in resolution for phase detection, and (4) uniform performance across all channels and multiple radio bands. The above described differences contribute to a multi-band RF transceiver supporting low phase noise requirements for standards such as GSM.

The advantages of the present invention include: (1) accurate phase detection with <0.5 LSB INL/DNL and high-resolution of 20 ps, (2) faster lock and PLL settling times, (3) very low power consumption fractional phase detection circuit (less than 0.5 mW), (4) very small area (0.01 mm$^2$) phase detection circuit, and (5) glitch/error free TDC output digital code resulting in faster acquisition and PLL settling times.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a time-to-digital converter (TDC) comprising an edge aligner adapted to compensate for phase differences between complementary high speed clocks input thereto, a complementary chain of inverters coupled to the output of the edge aligner and operative to generate a delayed clock vector of the input complementary high speed clocks and a plurality of complementary flip-flops coupled to the complementary chain of inverters and operative to sample the delayed clock vector in accordance with a frequency reference clock.

There is also provided in accordance with the invention, a time-to-digital converter (TDC) with on-line self calibration comprising a time-to-digital converter (TDC) comprising an edge aligner adapted to compensate for any phase difference between complementary high speed clocks input thereto, a complementary chain of inverters coupled to the output of the edge aligner and operative to generate a delayed clock replica vector of the input complementary high speed clocks, a plurality of differential flip-flops coupled to the complementary chain of inverters and operative to sample the delayed clock replica vector in accordance with a frequency reference clock and a self calibration circuit operative to receive the output of the plurality of differential flip-flops and to generate an inverter delay indicator therefrom.

There is further provided in accordance with the invention, a radio frequency (RF) frequency synthesizer for performing frequency modulation comprising a time-to-digital converter (TDC) comprising an edge aligner adapted to compensate for any phase difference between complementary high speed clocks input thereto, a complementary chain of inverters coupled to the output of the edge aligner and operative to generate a delayed clock replica vector of the input complementary high speed clocks, a plurality of differential flip-flops coupled to the complementary chain of inverters and operative to sample the delayed clock replica vector in accordance with a frequency reference clock and a digitally controlled oscillator (DCO) operative to generate an output frequency in accordance with the phase error output from the TDC.

There is also provided in accordance with the invention, a time-to-digital converter (TDC) system for generating an output timestamp, comprising a TDC operative to measure edge time delay from a high speed phase locked loop (PLL) clock to a reference frequency clock, a normalizer operative to normalize the delay output of the TDC to a period of the high speed PLL clock to generate a fractional portion of the output timestamp and a counter operative to count edges of the high speed PLL clock and to generate an integer portion of the output timestamp.

There is further provided in accordance with the invention, a time-to-digital converter (TDC) system for producing an output substantially independent from temperature and supply voltage variations, comprising a TDC operative to measure time separation between a high speed clock and a reference clock, a normalizer operative to normalize the output of the TDC to a period of the high speed clock to generate a fractional portion of the output and a counter operative to count edges of the high speed clock and to generate an integer portion of the output.

There is also provided in accordance with the invention, a time-to-digital converter (TDC) comprising a converter for transforming a single ended clock input into complementary high speed clock signals, an edge aligner adapted to compensate for phase differences between the complementary high speed clocks, a complementary chain of inverters coupled to the output of the edge aligner and operative to generate a delayed clock vector of the input complementary high speed clocks and a plurality of complementary flip-flops coupled to the complementary chain of inverters and operative to sample the delayed clock vector in accordance with a frequency reference clock.

There is further provided in accordance with the invention, a time-to-digital converter (TDC) system for generating an output timestamp, comprising a TDC operative to measure edge time delay from a high speed phase locked loop (PLL) clock to a reference frequency clock, a normalizer operative to normalize the delay output of the TDC to a period of the high speed PLL clock to generate a fractional portion of the output timestamp, means for self calibration coupled to the delay output of the TDC whereby the TDC output timestamp is insensitve to variations in process, voltage and temperature.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
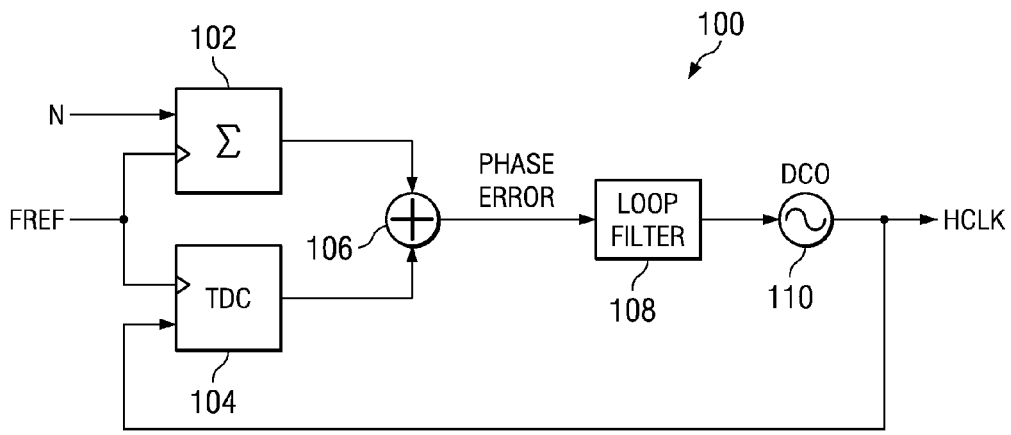
FIG. 1 is a block diagram illustrating the time-to-digital converter circuit used as a replacement for a phase/frequency detector and charge pump in an ADPLL based RF frequency synthesizer.

The following notation is used throughout this document.

| Term | Definition |
| --- | --- |
| ADC | Analog to Digital Converter |
| ADPLL | All Digital Phase Locked Loop |
| ASIC | Application Specific Integrated Circuit |
| CMOS | Complementary Metal Oxide Semiconductor |
| DBB | Digital Baseband |
| DCO | Digitally Controlled Oscillator |
| DCXO | Digitally Controlled Crystal Oscillator |
| DLL | Delay Locked Loop |
| DNL | Differential Nonlinearity |
| DPA | Digital Power Amplifier |
| DRP | Digital RF Processor or Digital Radio Processor |
| DSP | Digital Signal Processor |
| EDGE | Enhanced Data rates for Global Evolution |
| FOM | Figure-of-Merit |
| FPGA | Field Programmable Gate Array |
| FREF | Frequency Reference |
| GSM | Global System for Mobile Communication |
| HDL | Hardware Description Language |
| IC | Integrated Circuit |
| INL | Integral Nonlinearity |
| LAN | Local Area Network |
| LDO | Low Dropout |
| LSB | Least Significant Bit |
| MOS | Metal Oxide Semiconductor |
| NMOS | n-channel Metal Oxide Semiconductor |
| PLL | Phase Locked Loop |
| PM | Power Management |
| PMOS | p-channel Metal Oxide Semiconductor |
| PVT | Process Voltage Temperature |
| RF | Radio Frequency |
| RFBIST | RF Built In Self Test |
| SDM | Sigma Delta Modulator |
| SoC | System on Chip |
| SRAM | Static Random Access Memory |
| TDC | Time-to-Digital Converter |
| UWB | Ultra Wideband |
| WCDMA | Wideband Code Division Multiple Access |
| WLAN | Wireless Local Area Network |

Detailed Description of the Invention

The present invention provides a novel pseudo-differential circuit architecture for a time-to-digital converter (TDC) incorporating a phase aligner, inverter delay calibration and optional intelligent power management. The TDC can be used in an all-digital PLL (ADPLL) based transmitter for accurate phase detection with fast acquisition while avoiding false phase locks. The phase aligner circuit along with the pseudo-differential architecture ensures a high-resolution and highly linear TDC enabling very low phase noise system performance across all frequency bands of an RF transceiver. An ADPLL suitable for use in the present invention is described in more detail in U.S. application Ser. No. 11/203,019, filed Aug. 11, 2005, entitled "Hybrid Polar/Cartesian Digital Modulator", incorporated herein by reference in its entirety.

The phase aligner circuit is implemented with a power down mode enabling an edge predictor based system architecture for very low power consumption. A circuit technique (described in more detail infra) is used to support a dithering scheme applied on the reference clock to improve transmitter phase noise across all channels in all RF bands of operation, especially in integer-N channels. A differential flip-flop with a very fine metastability resolution window of better than 1 ps is used to ensure glitch free phase detection and to achieve faster phase lock in the system.

The invention is intended for use in a radio transmitter and transceiver but can be used in other applications as well, such as a general communication channel. The TDC circuit architecture can be used as a phase/frequency detector and charge pump replacement in an ADPLL within a digital radio processor. The pseudo-differential digital architecture of the TDC circuit makes it less sensitive to NMOS and PMOS transistor mismatches. The time conversion resolution is equal to an inverter propagation delay, for example 15–20 ps, depending on the particular process. The inverter propagation delay is the finest logic-level regenerative timing in CMOS. In addition, the TDC circuit of the present invention is self-calibrating with the estimation accuracy better than 1%. The TDC circuit can also serve as a CMOS process strength estimator for analog circuits in large system on chip (SoC) dies. The TDC circuit also incorporates power management circuitry to significantly reduce power consumption to a very low level.

The TDC architecture of the present invention takes advantage of the deep-submicron CMOS process strengths of ultra-fast logic switching while avoiding its weaker handling of voltage resolution. It is recognized that an inverter propagation delay is the finest logic-level regenerative timing method in CMOS. To this extent, the invention avoids any control of the inverter delay that would make it slower, such as using current starving techniques or increasing capacitive loads. To maximize performance, the invention also avoids fully differential structures that would require current biasing. The resolution of the TDC circuit of the present invention is the fastest possible intrinsic inverter delay (e.g., 15–20 ps in the particular CMOS process used).

The inverter delay calibration (self calibration) method is fully digital and only involves processing of the TDC circuit output. The TDC circuit of the present invention also functions as a built-in estimator of the process strength. The process strength estimate can be used to set the bias current of other analog circuits on the same SoC die. Note that the self-oscillating frequency of the 3-inverter ring oscillator structure is commonly used as a figure-of-merit (FOM) of the deep-submicron CMOS process strength.

To aid in understanding the principles of the present invention, the description of the time-to-digital converter is provided in the context of an all digital PLL (ADPLL) based RF frequency synthesizer. The TDC circuit of the present invention has been incorporated in the frequency synthesizer portion of a fully compliant GSM/EDGE radio constructed in 90 nm CMOS. The function of the TDC in this transceiver circuit is to measure the time difference between the edges of the 1.6–2.0 GHz high-speed PLL clock HCLK and the 26 MHz frequency reference clock FREF. It is appreciated, however, that the TDC circuit could easily be adapted for use in a broader range of applications, particularly in low-voltage digital CMOS environments where picosecond level accurate time interval measurements are required.

It is appreciated by one skilled in the art that the time-to-digital conversion circuit scheme of the present invention can be adapted for use with numerous other wireless communications standards such as EDGE, extended data rate Bluetooth, WCDMA, Wireless LAN (WLAN), Ultra Wideband (UWB), etc. It is appreciated, however, that the invention is not limited for use with any particular communication standard (wireless or otherwise) and may be used in radar, optical, wired and wireless applications. Further, the invention is not limited for use with a specific modulation scheme but is applicable to other complex amplitude modulation schemes as well.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

TDC Core Architecture

A block diagram illustrating the time-to-digital converter circuit used as a replacement for a phase/frequency detector and charge pump in an ADPLL based RF frequency synthesizer is shown in FIG. 1. The PLL circuit, generally referenced 100, comprises a TDC system block 104 comprising the TDC core circuit, reference phase accumulator 102, phase detector 106, loop filter 108 and digitally controlled oscillator (DCO) 110. In this example, the function of the time-to-digital converter (TDC) is to measure the timestamp of the frequency reference clock input. This is done by measuring edge timing difference between the 1.6–2.0 GHz high-speed PLL clock HCLK and the much lower speed 26 MHz frequency reference clock FREF. The frequency reference (FREF) input, derived from a crystal oscillator, and the HCLK clock are input to the TDC circuit 104.

In a deep-submicron CMOS process, time-domain resolution of a digital signal edge transition is superior to voltage resolution of analog signals. A successful design approach in this environment would exploit the paradigm by emphasizing (1) fast switching characteristics of MOS transistors: high-speed clocks and/or fine control of timing transitions; (2) high density of digital logic (264 kgates/mm$^2$ in this process) makes digital functions extremely inexpensive; and (3) small device geometries and precise device matching made possible by the fine lithography. While avoiding (1) biasing currents that are commonly used in analog designs; (2) reliance on voltage resolution; and (3) nonstandard devices that are not needed for memory and digital circuits.

The fractional phase error estimation is based on a time to digital converter (TDC). Due to the DCO edge counting nature, the phase quantization resolution described above is limited to ±½ of the variable or DCO clock cycle, $T_V$. For wireless applications, a finer phase resolution is required, which may be achieved without forsaking the digitally-intensive approach. The whole-clock-domain quantization error is corrected by means of a fractional error correction circuit which is based on a time-to-digital converter (TDC). The TDC measures the fractional delay difference between the reference clock and the next rising edge of the DCO clock HCLK. Its resolution is a single inverter delay, $\Delta t_{inv}$, (described in more detail infra) which in this deep-submicron CMOS process is considered the most stable logic-level regenerative delay and is shorter than 20 ps. This allows the implementation of a GSM-quality phase detection mechanism.

Figure 2:
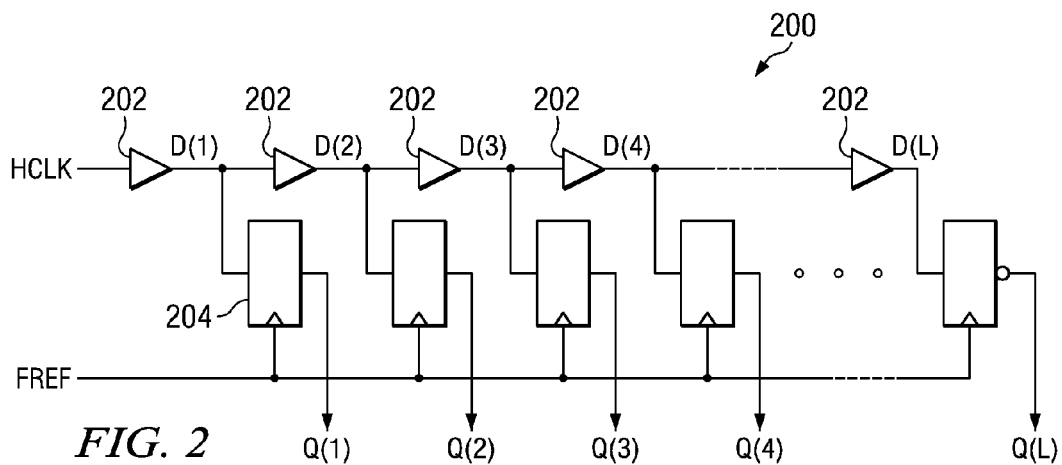
FIG. 2 is a block diagram illustrating a single ended time-to-digital converter circuit.

A block diagram illustrating a single ended time-to-digital converter circuit in more detail is shown in FIG. 2. The TDC circuit, generally referenced 200, comprises a plurality of buffers 202 and a plurality of flip-flops 204. This circuit architecture is one of the simplest possible realizations of a TDC core. In operation, the high-speed clock HCLK is passed through a string of non-inverting delay elements, e.g., buffers 202. The delayed clock vector D(1:L) is sampled by an array of flip-flops on the rising edge of the reference clock FREF. The pseudo-thermometer coded output Q(1:L) contains information regarding the timing separation between the rising edge of FREF and the rising and falling edges of the high-speed HCLK clock.

Figure 3:
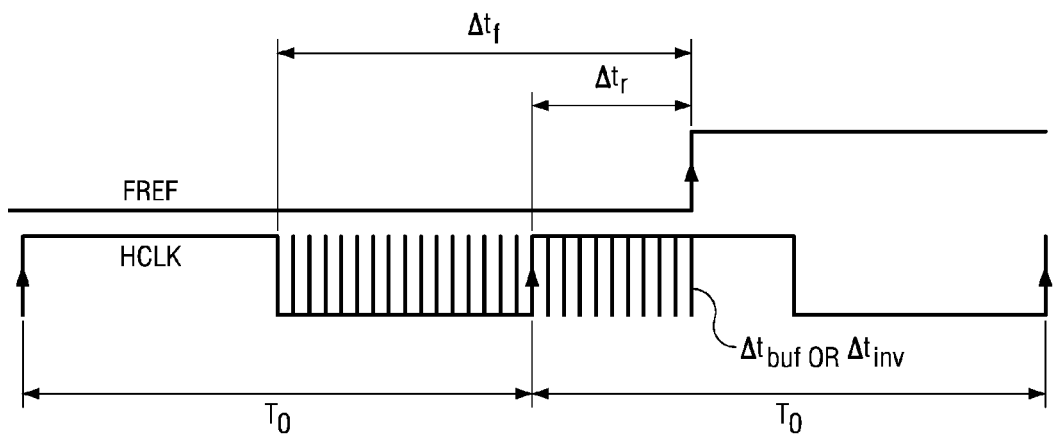
FIG. 3 is a diagram illustrating of time-to-digital converter core signals.

The timing separation between the rising edge of FREF and the rising edge of HCLK is denoted by $t_r$, while the timing separation between the rising edge of FREF and the falling edge of HCLK is denoted by $t_f$. The timing relationships $t_f$ and $t_r$ between the frequency reference FREF and HCLK are illustrated in FIG. 3.

Figure 4:
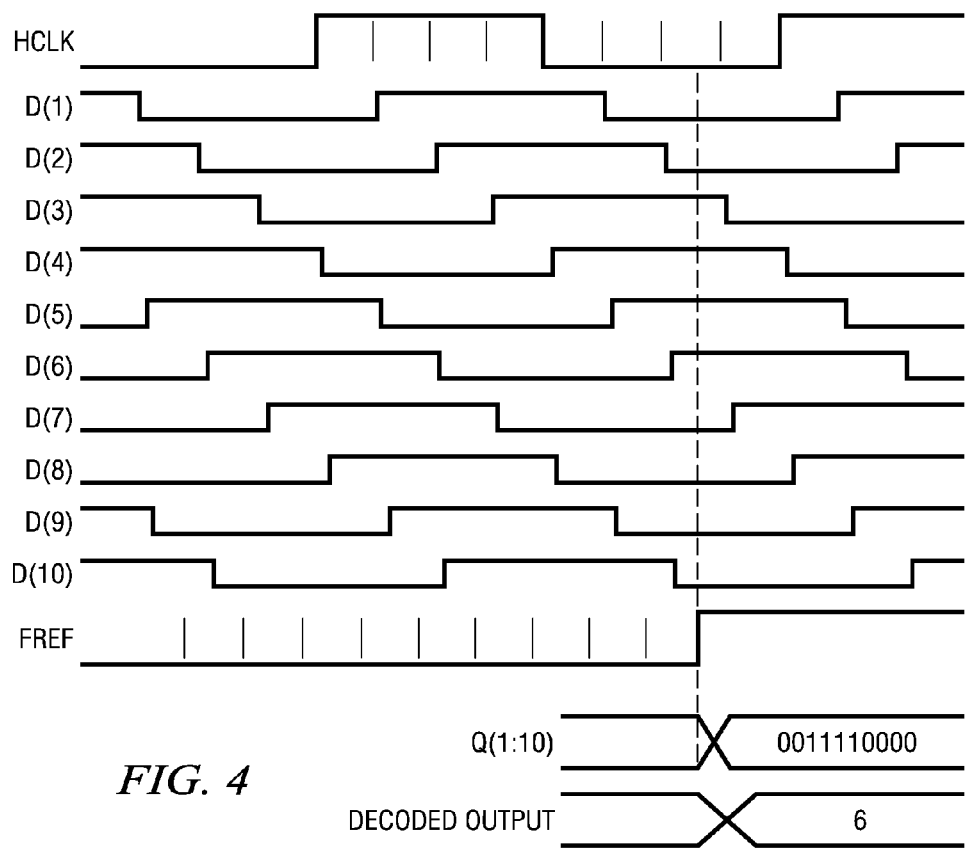
FIG. 4 is a timing diagram illustrating the timing of the TDC signals and decoded output.

A timing diagram illustrating the timing of the TDC signals and decoded output is shown in FIG. 4. In this example, the L=10 delayed signals are shown in relation to the HCLK and FREF clock signals. The vertical ticks in the HCLK and FREF signal traces represent the buffer delay as the HCLK signal propagates down the buffer chain. The pseudo-thermometer code output from the flip-flops can be converted to binary using a digital priority decoder (not shown). The decoder searches for the first one-to-zero transition that represents the $t_r$ HCLK-to-FREF delay (i.e. rising of HCLK to rising edge of FREF) in units of a buffer delay $t_{buf}$.

While this TDC architecture is elegant and relatively simple to implement, it suffers from poor timing resolution due to the use of the non-inverting delay elements. The present invention recognizes that the fastest logic level regenerative timing method in a standard CMOS process is the propagation time of an inverter. Since the non-inverting buffer is composed of two inverters, the inverter based TDC offers a significant improvement in the timing resolution by a factor of two.

Merely replacing the non-inverting delay-line buffers in the TDC circuit of FIG. 2 with inverters would suffer from (1) uneven transition times of the rising and falling edges of the delayed vector signal D(1:L), and (2) unbalanced metastability resolution of the flip-flops. This destroys the even-odd characteristic of the TDC resolution such that the inverter-based delay line TDC offers little advantage over the buffer-based approach.

To overcome the above disadvantages and drawbacks, the present invention provides a pseudo differential time-to-digital converter (TDC) architecture that realizes the resolution benefits of the inverter-based delay line. Preferably, the capacitive loading on the inverter delay chain is minimized in order to maximize the resolution. By minimizing the loading on the inverter delay chain, the TDC resolution is very close to the native CMOS inverter propagation delay. Depending on the particular CMOS process, this may be only 15–20 ps. Note that the native inverter propagation delay is expected to decrease as process technology advances, resulting in finer and finer resolution.

Figure 5:
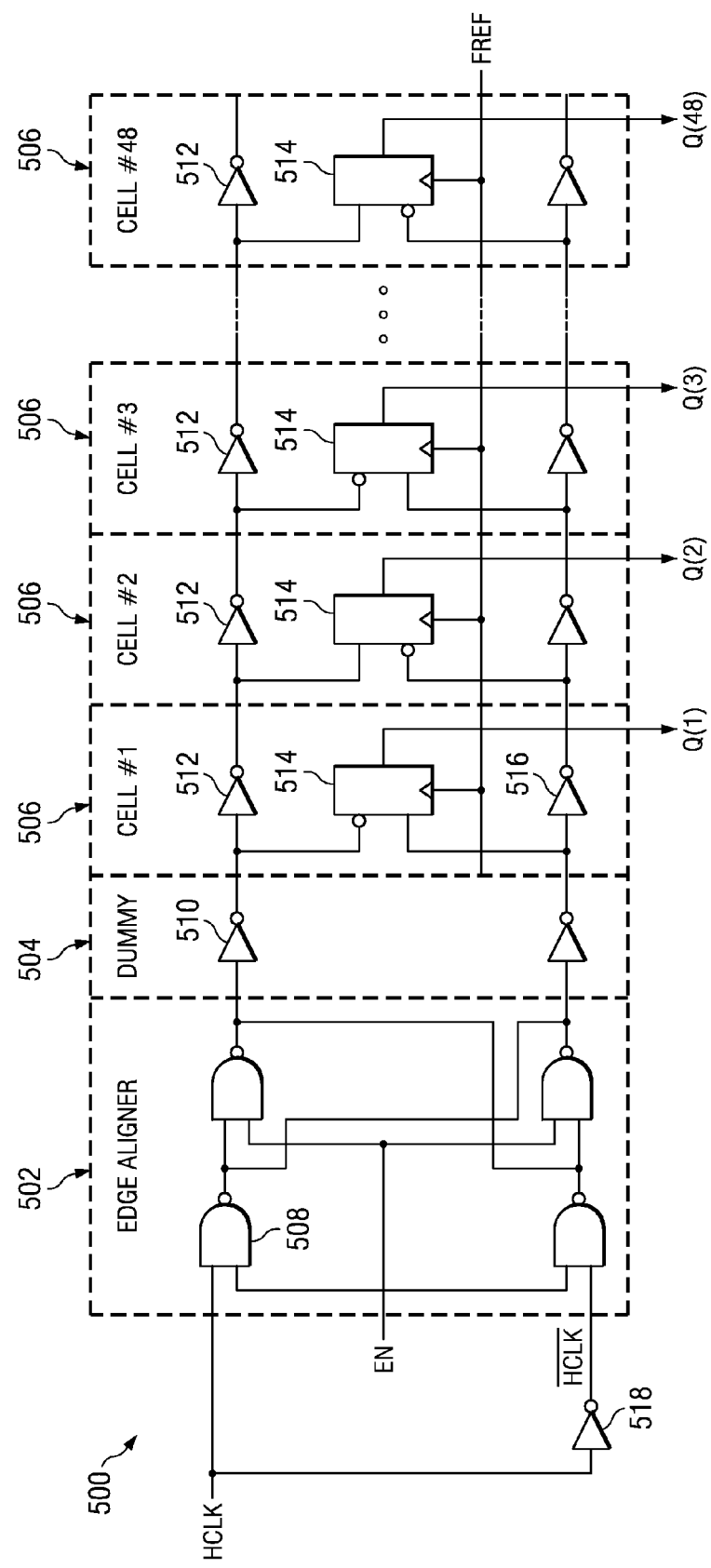
FIG. 5 is a block diagram illustrating an example embodiment of the time-to-digital converter circuit of the present invention.

A block diagram illustrating an example embodiment of the time-to-digital converter circuit of the present invention is shown in FIG. 5. The TDC core, generally referenced 500, comprises an edge aligner section 502, dummy inverter section 504 and a plurality of delay-and-sample cells 506. The example embodiment shown comprises L=48 delay stages wherein each delay cell comprises inverters 512, 516 and flip-flop 514. The edge aligner (or complementary signal generator/converter) 502 comprises a plurality of NAND gates 508. It is appreciated that any number of delay stages may used (e.g., between 24 and 64) and depends on the particular application.

The topology of the TDC core is pseudo differential in order to avoid any mismatch between rising and falling edge transitions due to differing strengths of the NMOS and PMOS transistors. The complementary high-speed clock $\overline{HCLK}$ is generated via inverter 518. To compensate for any phase difference in the high-speed complementary clocks (HCLK and $\overline{HCLK}$) due to routing mismatches, they are first edge aligned via edge aligner section 502 and then passed through a complementary string of L=48 inverters. The edge aligner is able to tolerate up to 50 ps of skew, so the negating feed can simply be replaced with an inverter 518. The delayed-clock replica vector is sampled by FREF using an array of 48 flip-flops. The flip-flops preferably comprise sense amplifier based flip-flops but may comprise any suitable type.

It is important to note that the edge aligner can accept either a single ended clock input or two potentially misaligned (away from their 180 degree desired alignment) complementary inputs and is operative to produce good quality, well aligned complementary clocks. In the case of a single ended input, a converter is provided to generate opposite phase clocks internally before edge alignment. In this case, the provision of a single ended clock or two opposite phase clocks is not critical to the invention.

The layout of the TDC core preferably comprises the 48 cells of the complementary inverters and differential flip-flops arranged in two parallel rows. The individual cells are laid out such that the inputs and outputs of the neighboring cells directly abut with the least amount of metal in order to minimize parasitic capacitance of the delay chain, thus minimizing the inverter delay. The balanced cell layout ensures equal delay of the complementary delay chains. In addition, every other cell is flipped along the horizontal axis in order to further desensitize the complementary delay mismatch from process gradients and external parasitics.

Figure 7:
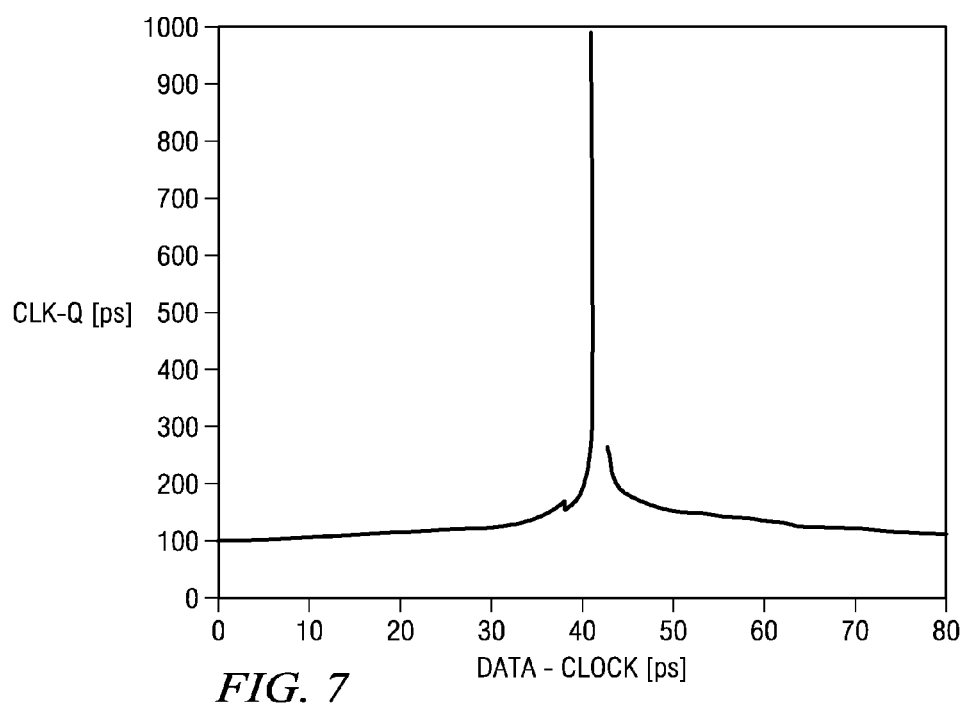
FIG. 7 is a diagram illustrating the simulated metastability characteristic of the symmetric flip-flop with full parasitic back annotation.
Figure 6:
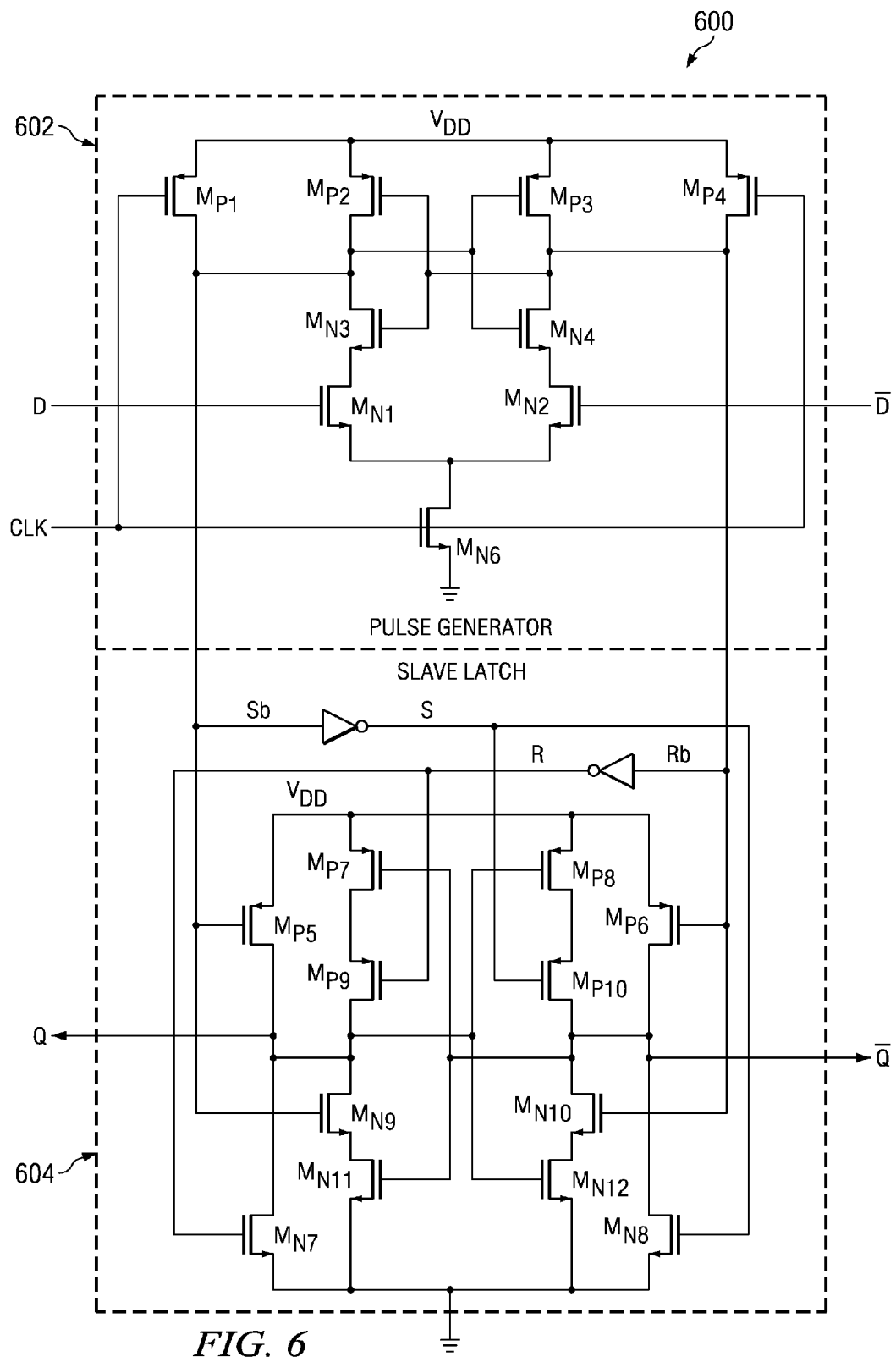
FIG. 6 is a circuit diagram illustrating the high-resolution symmetric flip-flop with complementary inputs of the TDC circuit of FIG. 5.

A circuit diagram illustrating the high-resolution symmetric flip-flop with complementary data inputs of the TDC circuit of FIG. 5 in more detail is shown in FIG. 6. Each flip-flop, generally referenced 600, comprises a pulse generator portion 602 adapted to receive the D, $\overline{D}$ and clock inputs, and a slave latch portion 604 adapted to generate the Q and $\overline{Q}$ outputs. The flip-flops are symmetrical along the vertical axis and provide identical resolution of the rising and falling edge metastability of their input data, as shown in FIG. 7 which is a diagram illustrating the simulated metastability characteristic of the symmetric flip-flop with full parasitic back annotation.

Note that the data input capacitative loading is only one NMOS gate and their interconnect capacitance parasitics are minimized. Referring to FIG. 7, the metastability window is very small: being within a resolution time of 1 ns, the metastability resolution window is less than 1 ps, which is much smaller than the inverter delay. This ensures no "bubbles" in the TDC pseudo-thermometer code and makes the inverter delay the only limitation of the TDC resolution. It is noted that a typical prior art flip-flop for high-speed digital designs features non-symmetrical metastability characteristic wherein the composite resolution window exceeds several inverter delays, which makes it unsuitable for application to the TDC pseudo-differential scheme of the present invention.

TDC Dither

Figure 8:
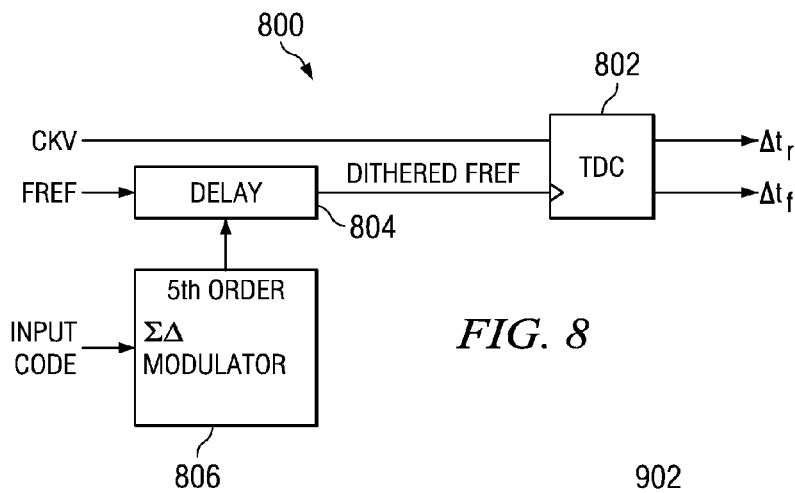
FIG. 8 is a block diagram illustrating a reference frequency FREF dither circuit.

As mentioned supra, the present invention uses a circuit technique to support a dithering scheme that is applied to the reference clock to improve transmitter phase noise across all channels in all RF bands of operation, especially in integer-N channels. A solution to the ill-conditioned integer-N TDC behavior is to randomize the instantaneous value of the timing difference in a ΣΔ manner as shown in FIG. 8, a block diagram illustrating a reference frequency FREF dither circuit. The FREF dither circuit, generally referenced 800, comprises a TDC 802, delay circuit 804 and ΣΔ modulator 806.

Figure 9:
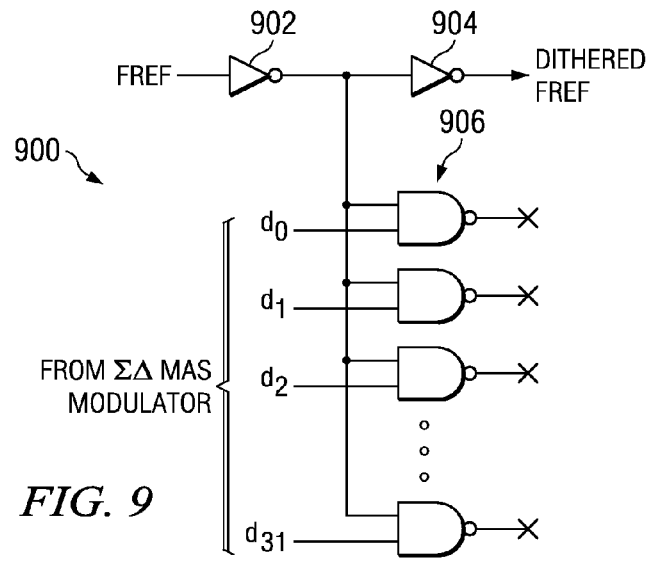
FIG. 9 is a block diagram illustrating the FREF delay circuit of FIG. 8 in more detail.

A constant input to the $5^{th}$ order ΣΔ MASH modulator (SDM) will create a high-speed unit-weighted 32-bit output whose time-averaged value equals that of the input. Its power spectral density is noise shaped with the quantization energy rising at higher frequencies. The 32-bit SDM output controls the FREF delay by changing the cumulative A-input capacitance of the 32 NAND gates by virtue of their B-input states, as shown in FIG. 9, a block diagram illustrating the FREF delay circuit of FIG. 8 in more detail. The delay circuit, generally referenced 900, comprises inverters 902, 904 and a plurality of NAND gates 906. Each NAND gate comprises A and B inputs and Y output. The Y outputs of each gate are left unconnected. Note that the static delay introduced by the circuit is inconsequential since the ADPLL loop will correct for it automatically.

TDC System

Figure 10:
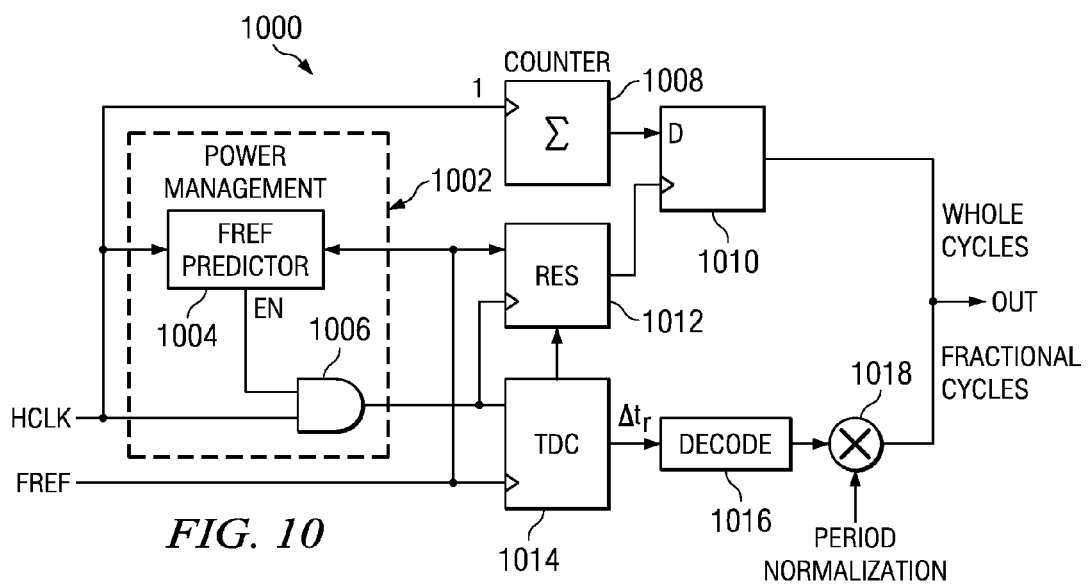
FIG. 10 is a block diagram illustrating the TDC system exhibiting large dynamic range and reduced power consumption utilizing clock gating.

A block diagram illustrating the TDC core within the larger TDC system is shown in FIG. 10. The TDC system, generally referenced 1000, comprises a TDC core 1014, decoder 1016, normalizer 1018, power management block 1002, edge counter 1008, flip-flop 1010 and resampler 1012. The power management block 1002 comprises reference frequency edge predictor circuit 1004 and gate 1006. The TDC system has the advantage of exhibiting large high dynamic range and reduced power consumption by the use of clock gating.

In operation, the 48-bit output of the TDC 1014 forms a pseudo-thermometer code, which is then converted to binary and normalized to the HCLK period, $T_0$. The number of inverters L (i.e. the number of delay cells) in the inverter chain is set to cover one period $T_0$. To arbitrarily increase the dynamic range, an edge counter 1008 having a sufficient word length is added to the circuit. The edge counter is adapted to count edges of the HCLK clock. The fixed-point TDC output timestamp comprises the sampled HCLK edge count (integer part) and the $T_0$-normalized delay from HCLK clock edge to FREF clock edge (fractional part). The time difference between the two FREF clock events is the difference between the two consecutive outputs. Note that in PLL applications, the absolute timestamps (phase) are more useful than the time difference (instantaneous frequency).

In addition, the edge locations of the reference clock FREF are predictable. Thus, significant power can be saved by gating off the TDC activity during 90% of the time between the reference clock edges by gating the HCLK with an enable signal EN generated by the FREF prediction circuit 1004. In order to avoid metastability between the edge counter and the TDC core, the FREF clock is resampled (block 1012) using the opposite phases of HCLK.

Figure 11:
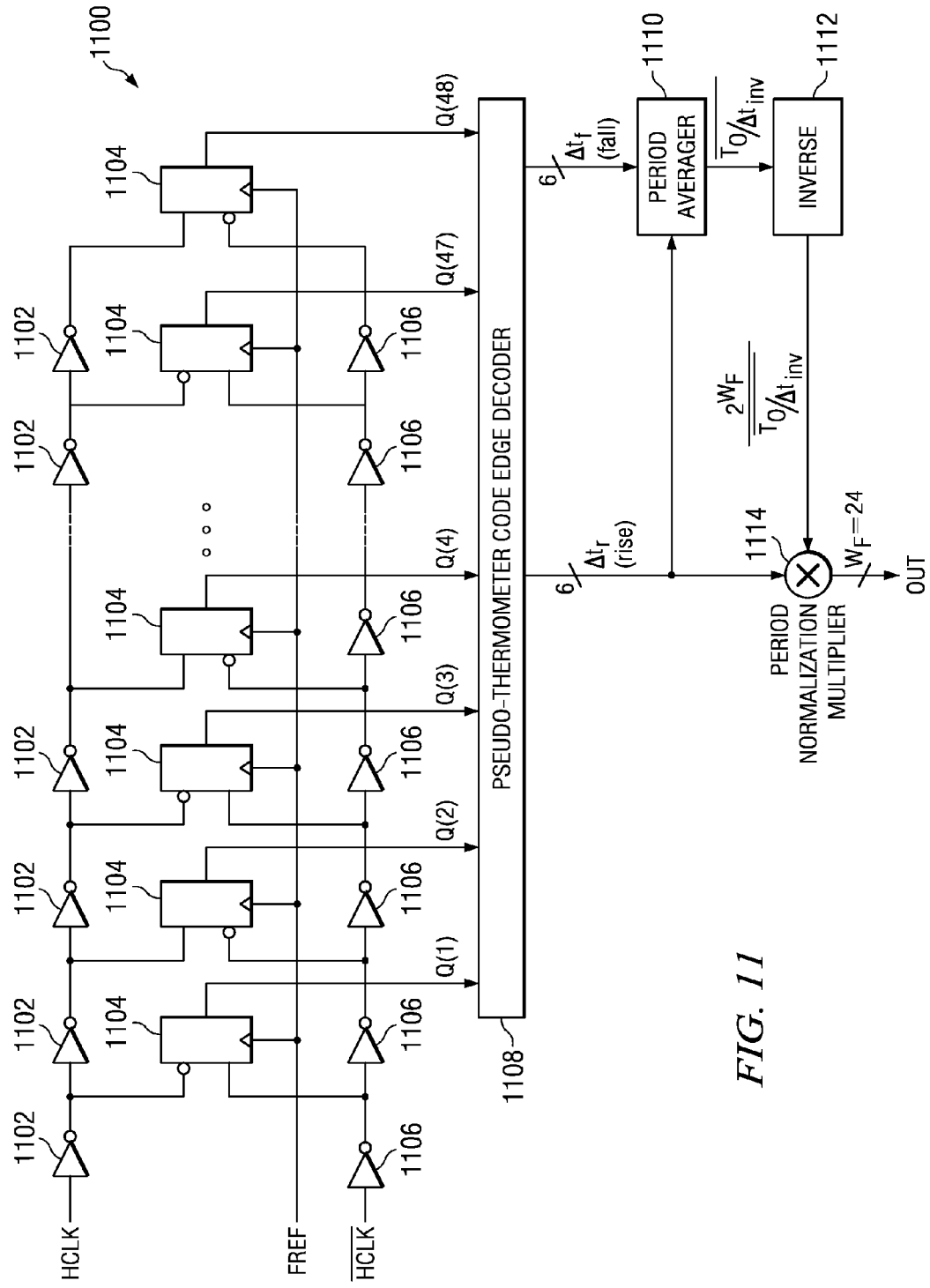
FIG. 11 is a block diagram illustrating an example embodiment of the time-to-digital converter of the present invention adapted to provide on-line calibration.

A block diagram illustrating an example embodiment of the time-to-digital converter of the present invention adapted to provide on-line calibration (self calibration) is shown in FIG. 11. The TDC on-line calibration circuit, generally referenced 1100, comprises an HCLK inverter chain 1102, an $\overline{\text{HCLK}}$ inverter chain 1106, a plurality of flip-flops 1104, pseudo-thermometer code edge decoder 1108, period averager 1110, inverse block 1112 and normalization multiplier 1114. In accordance with the invention, the TDC circuit is also self calibrating during normal operation for the process, voltage, temperature (PVT) variations in inverter delay. The absolute difference between the measured rising edge and falling edge delays of HCLK to FREF ($\Delta t_r$ and $\Delta t_f$, respectively, as shown in FIG. 3) is the half-period of HCLK in terms of number of inverters, i.e., half of $T_0/\Delta t_{inv}$. An accurate estimate of $T_0/\Delta t_{inv}$ is obtained through averaging, with an error below 1%. Its inverse is used for the fixed-point period normalization multiplier with $W_F$=24 fractional bits. This value divided by the HCLK frequency, $1/T_0$, is the inverter delay $\Delta t_{inv}$ in units of seconds and is read out to give an indication of the CMOS process strength.

Figure 12:
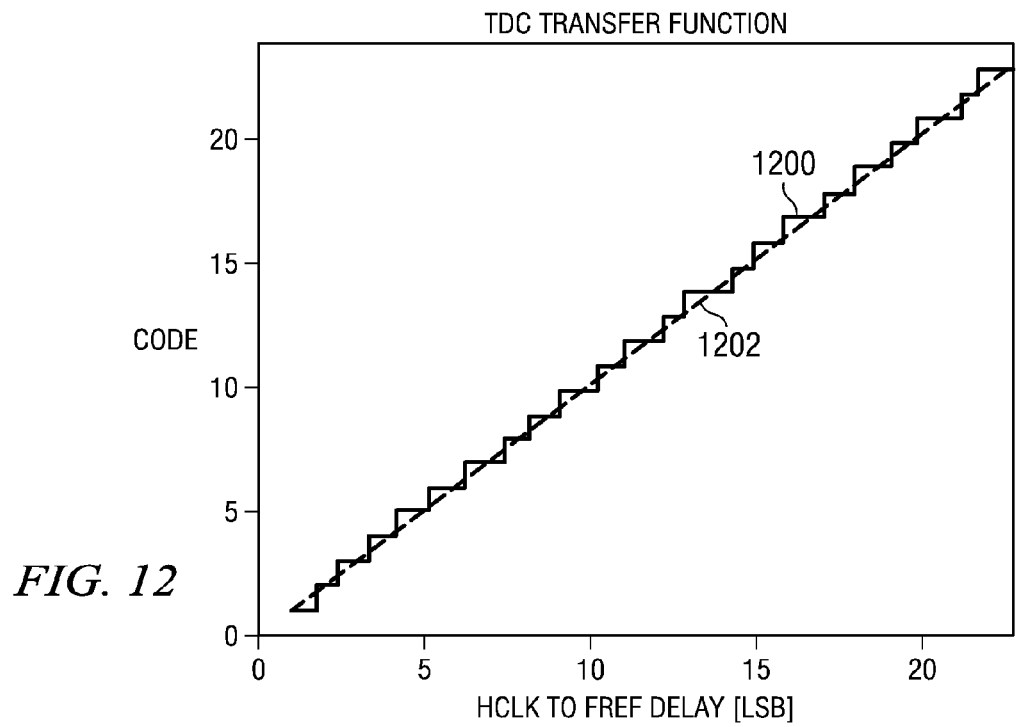
FIG. 12 is a diagram illustrating the measured transfer function of the time-to-digital converter circuit.

The TDC of the present invention has been realized within a fully compliant GSM/EDGE radio implemented in a digital 90 nm CMOS. The TDC circuit portion occupies 0.01 mm². The raw current consumption is 5.3 mA with a 1.3 V supply. The clock gating by the power management reduces the power consumption down to 1.4 mA. Measurements were carried out using an external $f_R$=26 MHz frequency reference clock FREF. The $f_0$=1.6–2.0 GHz high-speed clock HCLK is generated on-chip using a fractional-N frequency synthesizer by setting the fixed-point frequency multiplication ratio $N=f_0/f_R$ with $W_F$=24 bits of fractional resolution. The measured TDC transfer function is shown in FIG. 12. The measured transfer function is depicted by the curve 1200. The frequency division ratio N is set slightly off from an integer value so that the FREF and HCLK clocks experience slow edge rotation. The TDC output code is averaged out over a plurality of cycles, e.g., 15, to eliminate chatter. The superimposed straight line 1202 is the inverter delay or slope accurately calculated by the calibration hardware.

Figure 13:
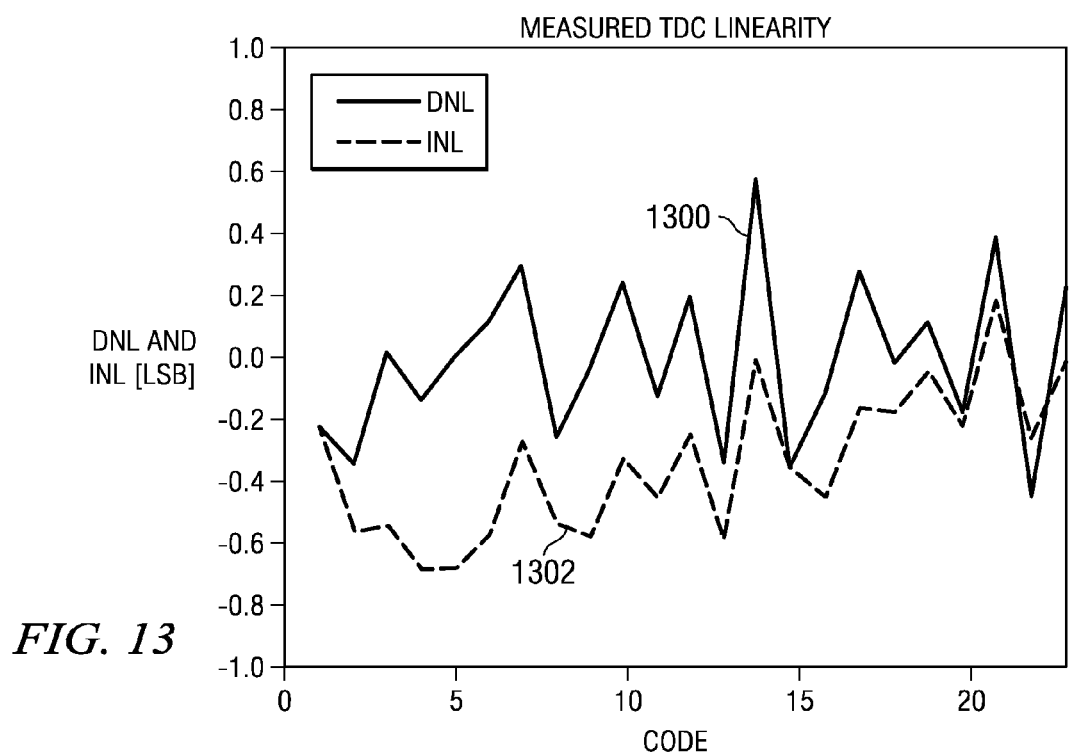
FIG. 13 is a diagram illustrating the measured linearity of the time-to-digital converter circuit.
Figure 14:
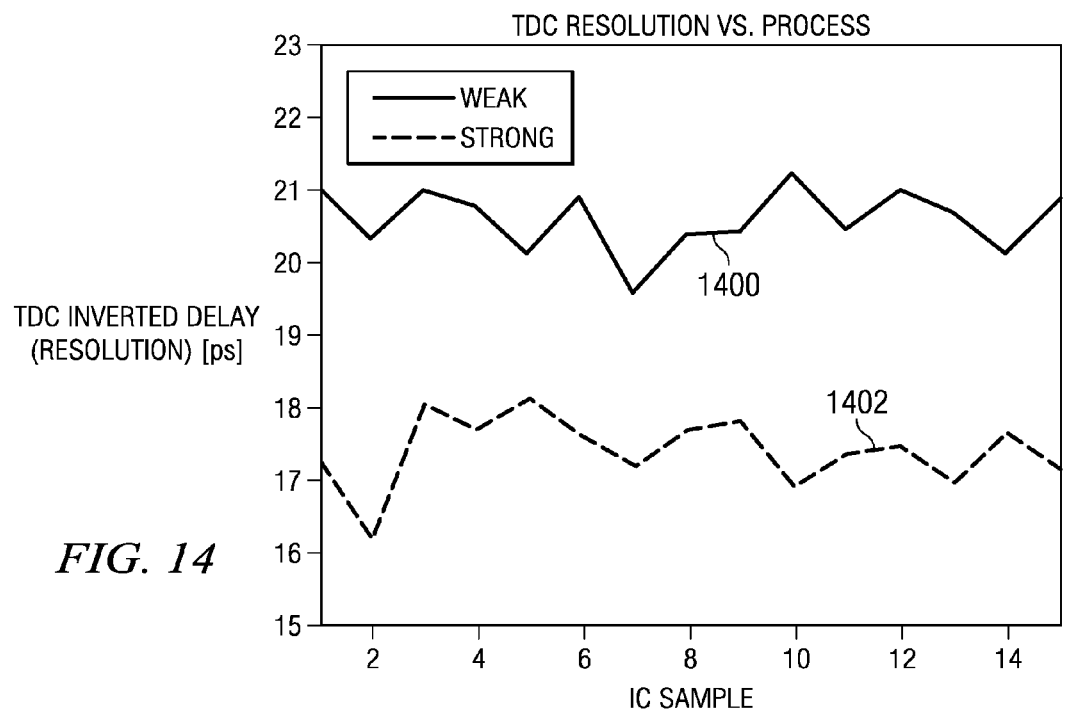
FIG. 14 is a diagram illustrating the measured resolution of the time-to-digital converter circuit versus process strength.
Figure 15:
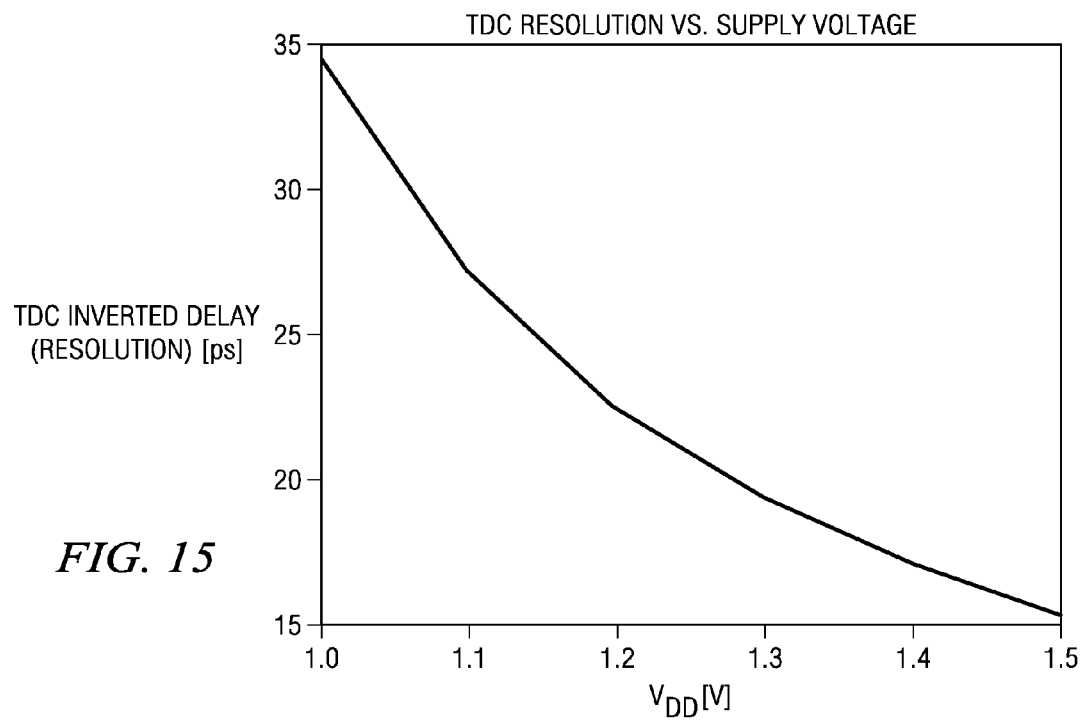
FIG. 15 is a diagram illustrating the measured resolution of the time-to-digital converter circuit versus supply voltage.

The measured nonlinearity of the TDC, shown in FIG. 13, is almost entirely dominated by the even-odd timing mismatch. The measured integral nonlinearity (INL) 1302 and differential nonlinearity (DNL) 1300 are both below 0.7 LSB. A diagram illustrating the measured resolution of the time-to-digital converter circuit versus process strength is shown in FIG. 14. The inverter delay $\Delta t_{inv}$, as determined by the numerical output of the calibration, is displayed in the y-axis. The distribution, based on 15 IC samples per process corner, is quite tight and a clear separation of 3 ps exists between the weak and strong process corners. A diagram illustrating the measured resolution of the time-to-digital converter circuit versus supply voltage is shown in FIG. 15. The temperature stability is 0.01 ps/° C. from −40 to ±85° C. No phase noise degradation at the RF output has been observed which would indicate TDC timing synchronization problems.

GSM/EDGE Transceiver Incorporating Pseudo-Differential TDC

Figure 16:
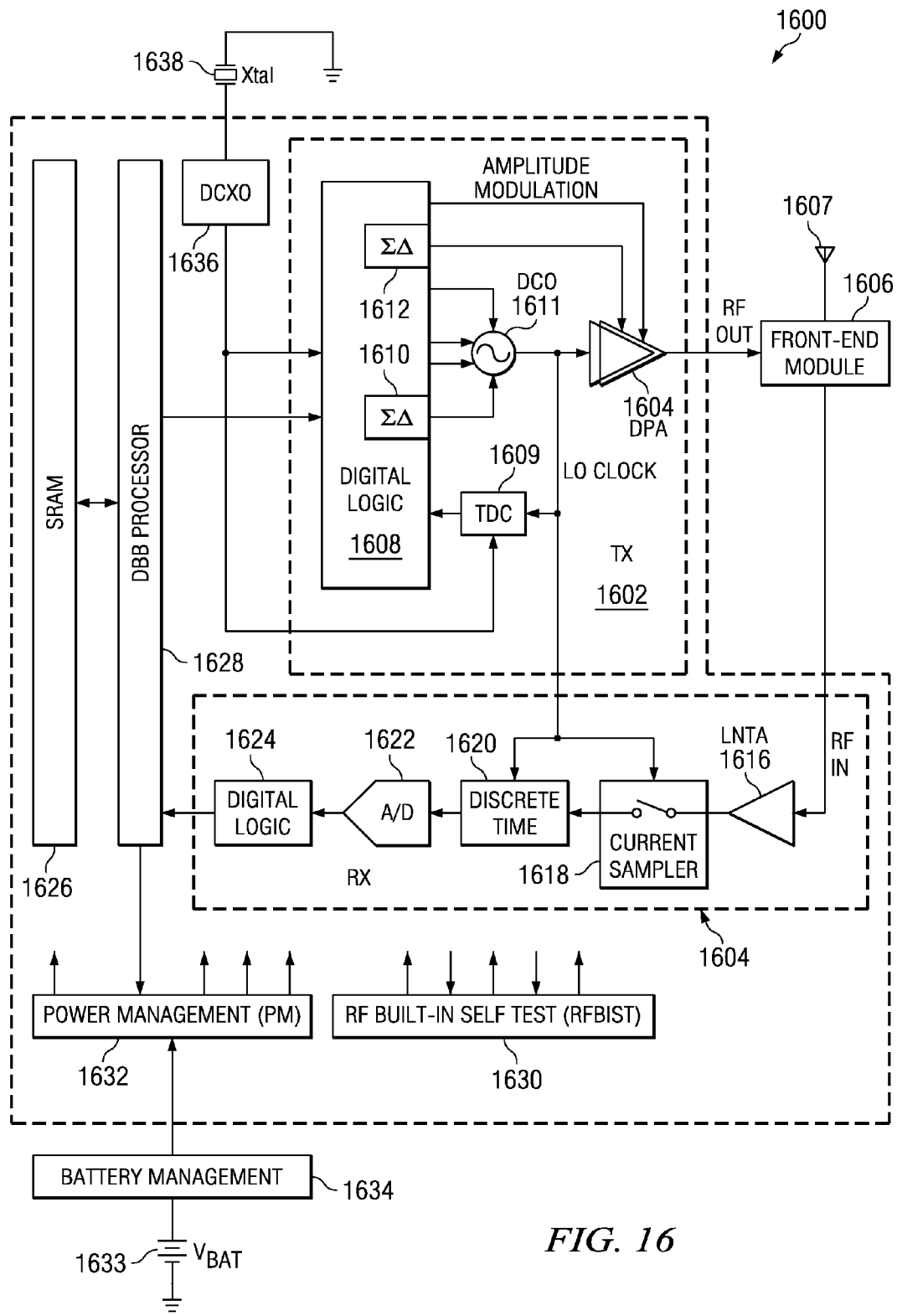
FIG. 16 is a block diagram illustrating a single-chip GSM/EDGE radio with an all-digital local oscillator and transmitter, and a discrete-time receiver incorporating the pseudo-differential time-to-digital converter of the present invention.

A block diagram illustrating a single-chip GSM/EDGE radio, which is based on the DRP technology, with an all-digital local oscillator and transmitter, and a discrete-time receiver incorporating the pseudo-differential time-to-digital converter of the present invention is shown in FIG. 16. The radio, generally referenced 1600, comprises a digital baseband (DBB) processor 1628, memory 1626, TX block 1602, RX block 1604, crystal 1638 and crystal oscillator 1636, front-end module 1606 and antenna 1607, power management unit 1632, RF built-in self test 1630, battery 1633 and battery management circuit 1634. The TX block comprises digital logic block 1608 comprising the pseudo-differential time-to-digital converter of the present invention 1609, ΣΔ modulators 1610, 1612, digitally controlled oscillator (DCO) 1611 and digital power amplifier (DPA) 1614. The RX block comprises a low noise transconductance amplifier 1616, current sampler 1618, discrete time block 1620, A/D converter 1622 and digital logic block 1624.

FIG. 14 provides an overview of key circuits of a single-chip GSM/EDGE radio, with the local oscillator and transmitter described in more detail in U.S. patent application Ser. No. 11/203,019, filed Aug. 11, 2005, entitled "Hybrid Polar/Cartesian Digital Modulator", similarly assigned and incorporated herein by reference in its entirety. A key component is the digitally controlled oscillator (DCO) 1611, which avoids any analog tuning controls. Fine frequency resolution is achieved through high-speed ΣΔ dithering of its varactors. Digital logic built around the DCO comprises the pseudo-differential TDC circuit 1609 of the present invention. The digital logic realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 1614 for the amplitude modulation. The DPA operates in near-class-E mode and uses an array of NMOS transistor switches to regulate the RF amplitude. It is followed by a matching network and an external front-end module 1606, which comprises a power amplifier (PA) and a transmit/receive switch for the common antenna 1607. Fine amplitude resolution is achieved through high-speed ΣΔ dithering of the DPA NMOS transistors.

The receiver 1604 employs a discrete-time architecture in which the RF signal is directly sampled at the Nyquist rate of the RF carrier and processed using analog and digital signal processing techniques. The transceiver is integrated with a dedicated DBB processor 1628 and SRAM memory 1626. The frequency reference (FREF) is generated on-chip by a 26 MHz digitally controlled crystal oscillator (DCXO) 1636. The integrated power management (PM) 1632 consists of multiple low-dropout (LDO) voltage regulators that also isolate supply noise between circuits. The RF built-in self-test (RFBIST) 1630 performs autonomous phase noise and modulation distortion testing as well as various loop-back configurations for bit-error-rate measurements. Almost all the clocks on this SoC are derived from and are synchronous to the RF oscillator clock. This helps to reduce susceptibility to the noise generated through clocking of the massive digital logic.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A time-to-digital converter (TDC), comprising:
   an edge aligner adapted to compensate for phase differences between complementary high speed clocks input thereto;
   a complementary chain of inverters coupled to the output of said edge aligner and operative to generate a delayed clock vector of said input complementary high speed clocks; and
   a plurality of complementary flip-flops coupled to said complementary chain of inverters and operative to sample said delayed clock vector in accordance with a frequency reference clock.

2. The TDC according to claim 1, further comprising a pair of dummy invaders coupled between the output of said edge aligner and the input to said complementary chain of inverters.

3. The TDC according to claim 1, wherein each leg of said complementary chain of inverters comprises 24 to 64 invaders.

4. The TDC according to claim 1, wherein said plurality of complementary flip-flops comprises differential flip-flops.

5. The TDC according to claim 1, wherein said differential flip-flops comprise sense-amplifier based differential flip-flops.

6. The TDC according to claim 5, wherein said sense-amplifier based differential flip-flops are optimized for a very low metastability resolution window.

7. The TDC according to claim 1, wherein said edge aligner comprises means for putting said TDC in a low power operation mode in response to an enable control signal input thereto.

8. The TDC according to claim 1, further comprising power management means operative to shut down said TDC in response to an enable control signal input thereto.

9. The TDC according to claim 1, adapted to be implemented in an Application Specific Integrated Circuit (ASIC).

10. The TDC according to claim 1, adapted to be implemented in a Field Programmable Gate Array (FPGA).

11. A time-to-digital converter (TOG) with on-line self calibration, comprising:
    a time-to-digital converter (TOG), comprising:
       an edge aligner adapted to compensate for any phase difference between complementary high speed clocks input thereto;
       a complementary chain of inverters coupled to the output of said edge aligner and operative to generate a delayed clock replica vector of said input complementary high speed clocks:
       a plurality of differential flip-flops coupled to said complementary chain of inverters and operative to sample said delayed clock replica vector in accordance with a frequency reference clock; and
    a self calibration circuit operative to receive the output of said plurality of differential flip-flops and to generate an inverter delay indicator therefrom.

12. The apparatus according to claim 11, wherein said self calibration circuit comprises:
    a pseudo-thermometer code edge decoder operative to measure the absolute difference between the rising and falling edge delays of sat high speed clock to said frequency reference;
    means for calculating an estimate of $T_0/\Delta t_{inv}$ wherein $T_0$ is the period of said high speed clock an estimate and $\Delta t_{inv}$ the inverter delay;
    means for inverting said estimate; and
    period normalization multiplier operative to generate said indicator of process strength.

13. The apparatus according to claim 11, further comprising a pair of dummy inverters coupled between the output of said edge aligner and the input to said complementary chain of inverters.

14. The apparatus according to claim 11, wherein each leg of said complementary chain of inverters comprises 24 to 64 inverters.

15. The apparatus according to claim 11, wherein said plurality of differential flip-flops comprises 24 to 64 differential flip-flops.

16. The apparatus according to claim 11, wherein said differential flip-flops comprise sense-amplifier based differential flip-flops.

17. The apparatus according to claim 16, wherein said sense-amplifier based differential flip-flops are optimized for a very low metastability resolution window.

18. The apparatus according to claim 11, wherein said edge aligner comprises means for putting said TDC in a low power operation mode in response to an enable control signal input thereto.

19. The apparatus according to claim 11, adapted to be implemented in an Application Specific Integrated Circuit (ASIC).

20. The apparatus according to claim 11, adapted to be implemented in a Field Programmable Gate Array (FPGA).

21. A radio frequency (RF) frequency synthesizer for performing frequency modulation, comprising:
   a time-to-digital converter (TDC), comprising:
      an edge aligner adapted to compensate for any phase difference between complementary high speed docks input thereto;
      a complementary chain of inverters coupled to the output of said edge aligner and operative to generate a delayed clock replica vector of said input complementary high speed clocks;
      a plurality of differential flip-flops coupled to said complementary chain of inverters and operative to sample said delayed clock replica vector in accordance with a frequency reference clock; and
   a digitally controlled oscillator (DCO) operative to generate an output frequency in accordance with the phase error output from said TDC.

22. A time-to-digital converter (TDC) system for generating an output timestamp, comprising:
   a TDC operative to measure edge time d&ay from a high speed phase locked loop (PLL) clock to a reference frequency clock;
   a normalizer operative to normalize the delay output of said TOG to a period of said high speed PLL clock to generate a fractional portion of said output timestamp; and
   a counter operative to count edges of said high speed PLL clock and to generate an integer portion of said output timestamp.

23. The TOG system according to claim 22, wherein said TOG comprises:
   an edge aligner adapted to compensate for any phase difference between complementary high speed clocks input thereto;
   a complementary chain of inverters coupled to the output of said edge aligner and operative to generate a delayed clock replica vector of said input complementary high speed clocks; and
   a plurality of differential flip-flops coupled to said complementary chain of inverters and operative to sample said delayed clock replica vector in accordance with a frequency reference clock.

24. The TOG system according to claim 22, further comprising a reference frequency predictor operative to predict the location of reference frequency dock edges to enable significant power reduction of said TDC system.

25. A time-to-digital converter (TDC) system for producing an output substantially independent from temperature and supply voltage variations.comprising:
   a TDC operative to measure time separation between a high speed clock and a reference clock;
   a normalizer operative to normalize the output of said TOG to a period of said high speed clock to generate a fractional portion Of said output and
   a counter operative to count edges of said high speed clock and to generate an integer portion of said output.

26. A time-to-digital converter (TDC), comprising
   a converter for transforming single ended clock input into complementary high speed Clock signals;
   an edge Signer adapted to compensate for phase differences between said complementary high speed docks;
   a complementary chain of inverters coupled to the output of said edge aligner and operative to generate a delayed dock vector of said input complementary high speed docks; and
   a plurality of complementary flip-flops coupled to said complementary chain of inverters and operative to sample said delayed clock vector in accordance with a frequency reference clock.

27. A time-to-digital converter (TDC) system for generating an output timestamp, comprising:
   a TDC operative to measure edge time delay from a high speed phase locked loop (PLL) clock to a reference frequency clock;
   a normalizer operative to normalize the delay output of said TDC to a period of said high speed PLL clock to generate a fractional portion of said output timestamp;
   means for self calibration coupled to the delay output of said TDC whereby said TDC output timestamp is insensitive to variations in process, voltage and temperature.

* * * * *